(12) United States Patent
Tonari et al.

(10) Patent No.: US 8,440,551 B2
(45) Date of Patent: May 14, 2013

(54) PLASMA DOPING METHOD AND MANUFACTURING METHOD OF SEMICONDUCTOR DEVICE

(75) Inventors: Kazuhiko Tonari, Susono (JP); Tsutomu Nishihashi, Susono (JP)

(73) Assignee: ULVAC, Inc., Kanagawa (JP)

( * ) Notice: Subject to any disclaimer, the term of this patent is extended or adjusted under 35 U.S.C. 154(b) by 0 days.

(21) Appl. No.: 13/469,229

(22) Filed: May 11, 2012

(65) Prior Publication Data

US 2012/0220096 A1  Aug. 30, 2012

Related U.S. Application Data

(62) Division of application No. 13/054,825, filed as application No. PCT/JP2009/064047 on Aug. 7, 2009.

(30) Foreign Application Priority Data

Aug. 15, 2008  (JP) .................................. 2008-209283
Aug. 29, 2008  (JP) .................................. 2008-221107

(51) Int. Cl.
*H01L 21/26* (2006.01)
*H01L 21/42* (2006.01)

(52) U.S. Cl.
USPC ........ 438/513; 438/14; 438/515; 156/345.24; 257/E21.317

(58) Field of Classification Search .................. 438/513, 438/515, 14
See application file for complete search history.

(56) References Cited

U.S. PATENT DOCUMENTS

| | | |
|---|---|---|
| 2005/0227463 A1 | 10/2005 | Ito et al. |
| 2007/0059848 A1 | 3/2007 | Sasaki et al. |
| 2007/0166846 A1 | 7/2007 | Sasaki et al. |
| 2008/0142931 A1 | 6/2008 | Sasaki et al. |

FOREIGN PATENT DOCUMENTS

| | | |
|---|---|---|
| CN | 101071768 A | 11/2007 |
| CN | 101076879 A | 11/2007 |
| JP | 2002-170783 A | 6/2002 |
| JP | 2004-128210 A | 4/2004 |
| JP | 2005-005328 A | 1/2005 |
| JP | 2005-093518 A | 4/2005 |
| JP | 2005-277220 A | 10/2005 |
| WO | WO2005/034221 A1 | 4/2005 |

OTHER PUBLICATIONS

International Search Report for PCT Patent App. No. PCT/JP2009/064047 (Nov. 10, 2009).
Office Action from Chinese Patent App. No. 200980131469.6 (Mar. 6, 2012).

*Primary Examiner* — Alexander Ghyka
(74) *Attorney, Agent, or Firm* — Cermak Nakajima LLP; Tomoko Nakajima

(57) ABSTRACT

A plasma doping method capable of introducing impurities into an object to be processed uniformly is supplied. Plasma of a diborane gas containing boron, which is a p-type impurity, and an argon gas, which is a rare gas, is generated, and no bias potential is applied to a silicon substrate. Thereby, the boron radicals in the plasma are deposited on the surface of the silicon substrate. After that, the supply of the diborane gas is stopped, and bias potential is applied to the silicon substrate. Thereby, the argon ions in the plasma are radiated onto the surface of the silicon substrate. The radiated argon ions collide with the boron radicals, and thereby boron radicals are introduced into the silicon substrate. The introduced boron radicals are activated by thermal processing, and thereby a p-type impurity diffusion layer is formed in the silicon substrate.

4 Claims, 11 Drawing Sheets

Fig.10
(A)
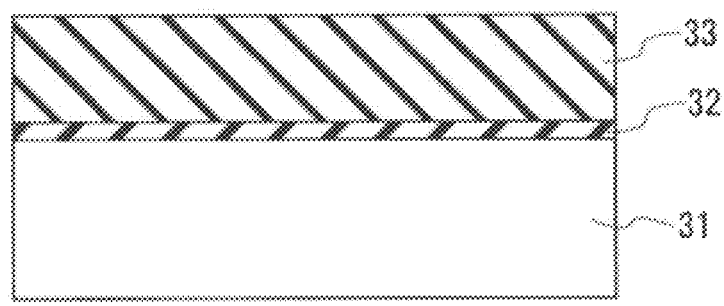
(B)
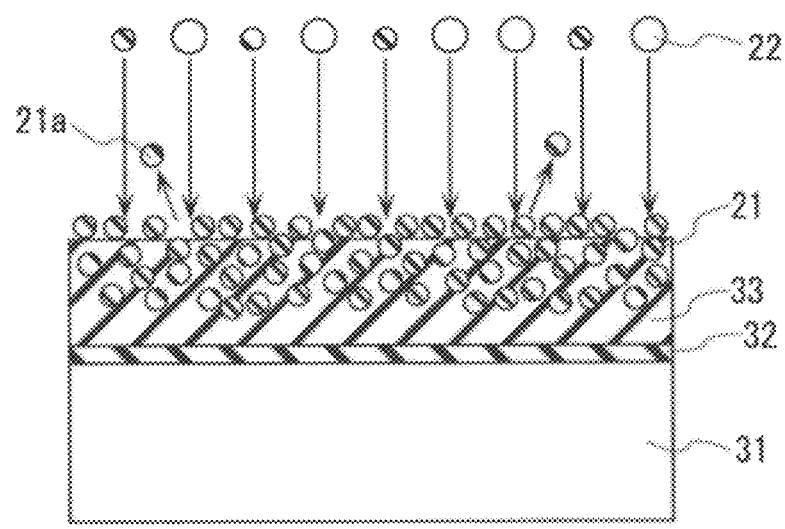

Fig.11
(A)
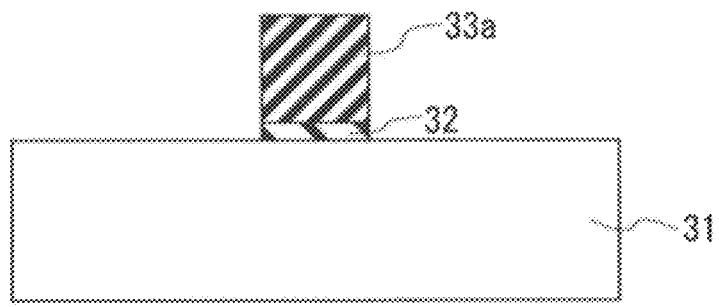
(B)
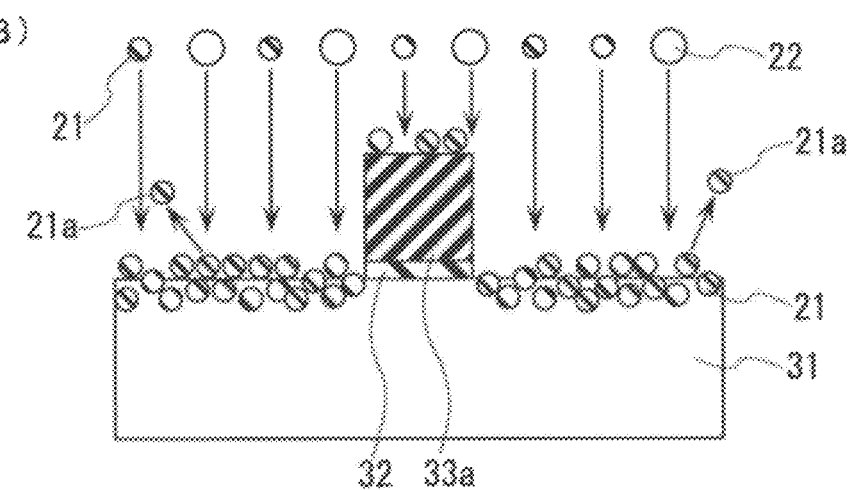
(C)
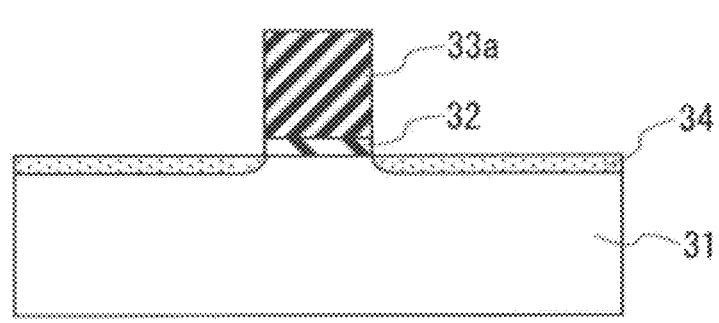

PLASMA DOPING METHOD AND MANUFACTURING METHOD OF SEMICONDUCTOR DEVICE

This application is a Divisional of, and claims priority under 35 U.S.C. §120 to, U.S. patent application Ser. No. 13/054,825, filed on Jan. 19, 2011, which was a national phase entry under 35 U.S.C. §371 of PCT Patent Application No. PCT/JP2009/064047, filed on Aug. 7, 2009, which claims priority under 35 U.S.C. §119 to Japanese Patent Application No. 2008-209283, filed Aug. 15, 2008, and Japanese Patent Application No. 2008-221107, filed Aug. 29, 2008, all of which are incorporated by reference.

TECHNICAL FIELD

The present invention relates to a plasma doping method for introducing impurities into the inside of an object to be processed and a manufacturing method of semiconductor device including a formation step of an extension region.

BACKGROUND ART

It is known that a short channel effect, in which a leakage current flows at the time of an off-operation of a transistor, arises in an MISFET (Metal Insulator Silicon Field Effect Transistor), which is one of semiconductor devices, when the gate length thereof is short, and it is known to form an extension region which is shallow than the source/drain regions in order to suppress the short channel effect.

In the formation of such an extension region, it is required to form the depth thereof to be more shallow (e.g. 10 nm or less) in association with the recent further miniaturization of the MISFET. The extension region is generally formed by introducing impurities into a substrate, and after that, by activating the introduced impurities by the thermal processing thereof. For the introduction of the impurities, an ion implantation method of accelerating ions of impurities to inject the ions into a substrate has conventionally been used. In order to form a shallow extension region by the use of the ion implantation method, it is necessary to make the acceleration energy of ions small. If the ions of the impurities desired to be introduced are light, such as boron ions, many accelerated ions have diffused before they reach the substrate when their acceleration energy is made to be small. Consequently, it was difficult to form a shallow extension region by the use of the ion implantation method.

Accordingly, it is known to use a plasma doping method of introducing impurities into a substrate by exposing the substrate to plasma containing the impurities therein that are desired to be introduced, and by applying bias potential to the substrate (see, for example, patent document 1).

In the plasma doping method described in the patent document 1, a phenomenon in which radicals in the plasma deposit on a surface of the substrate and a phenomenon in which ions accelerated by the bias potential are radiated onto the substrate to be drawn into the substrate simultaneously occur. It is needed to deposit the radicals uniformly on the surface of the substrate and to radiate the ions uniformly to the substrate here in order to introduce the impurities uniformly in the substrate by using the plasma doping method. That is, it is necessary to obtain a uniform in-plane distribution of the radicals and a uniform in-plane distribution of ions on the surface of the substrate.

In order to obtain the uniform in-plane distribution of the ions on the surface of the substrate, it is possible to control the plasma by, for example, a magnetic field. However, because the radicals and the ions are different from each other in the existence of electric charges and the like, and because the radicals exist more than the ions in the plasma, the plasma controlled in order to obtain the uniform in-plane distribution on the surface of the substrate does not enable the obtainment of the uniform in-plane distribution of the radicals on the surface of the substrate, and does not enable the uniform deposition of the radicals on the surface of the substrate. As a result, the plasma doping method described in the patent document 1 has a problem of the impossibleness of the uniform introduction of impurities into the substrate because the method cannot simultaneously secure both of the uniform in-plane distributions of the radicals and the ions on the surface of the substrate.

Moreover, the plasma doping method causes a disadvantage of the etching of the surface of the substrate by the ions because the drawing speed of the ions is generally faster than the depositing speed of the radicals in the processing apparatus executing the plasma doping method described in the patent document 1. Consequently, if the plasma doping method described in the patent document 1 is applied to the formation of the extension region, the shallow extension region could be formed, but the surface of the substrate is etched, and consequently the sheet resistance value of the extension region formed in the substrate is high.

PRIOR ART DOCUMENT

Patent Document

Patent Document 1: JP-A-2004-128210

SUMMARY OF THE INVENTION

Problems to be Solved by the Invention

In view of the respects described above, a first problem of the present invention is to provide a plasma doping method capable of introducing impurities uniformly into the inside of an object to be processed. Moreover, a second problem of the present invention is to provide a plasma doping method capable of preventing the object to be processed from being etched by the ions. Moreover, a third problem of the present invention is to provide a manufacturing method of a semiconductor device having an extension region in which impurity concentration is uniform. Moreover, a fourth problem of the present invention is to provide a manufacturing method of a semiconductor device capable of forming a low resistance extension region.

Means for Solving the Problems

In order to solve the first problem, a plasma doping method of the present invention is that of introducing impurities into an inside of an object to be processed. The method comprises: a first step of generating plasma of a gas containing the impurities to deposit radicals of the impurities in the plasma on a surface of an object to be processed; and a second step of radiating ions to the radicals deposited on the surface of the object to be processed at the first step. In addition, the object to be processed to which the impurities are introduced in the present invention includes not only a substrate but also a film.

According to the present invention, because the step of depositing the radicals of the impurities on the surface of the object to be processed and the step of radiating the ions on the surface of the object to be processed are separated from each other, the in-plane distribution of the radicals of the impurities deposited on the surface of the object to be processed and the in-plane distribution of the ions radiated to the surface of the object to be processed can independently be controlled. Therefore, the in-plane distribution of the radicals containing the impurities on the surface of the object to be processed is improved at the first step, and the ions are radiated to the radicals of the impurities, the in-plane distribution of which has been improved. Thereby, the impurities can be introduced uniformly into the inside of the projecting object.

In the present invention, it is appropriate to set a time until the radicals deposited at the first step do not exist on the surface of the object to be processed based on an etching rate of the radicals of the impurities etched by the ions radiated at the second step, and to perform the second step for the set time. Hereby, the radiation of the ions can be ended at the time point when the radicals of the impurities do not exist on the surface of the object to be processed. Consequently, the etching of the surface of the object to be processed by the ions can be prevented, and the rises of the sheet resistance value of the object to be processed can be prevented.

In the present invention, if the first and the second steps are executed in a same processing chamber, it is appropriate to generate the plasma of the gas containing the impurities and not to apply any bias potential to a substrate at the first step, and it is appropriate to stop the supply of the gas containing the impurities and to apply bias potential to the substrate at the second step.

In order to solve the second problem, a plasma doping method of the present invention is that of generating plasma of a gas containing impurities and of introducing radicals of the impurities in the plasma into an inside of an object to be processed by means of ions while depositing the radicals on a surface of the object to be processed, wherein a depositing speed of the radicals to the surface of the object to be processed and an etching speed of the radicals etched by the ions are made to be equal to each other. In addition, the object to be processed into which the impurities are introduced is not only a substrate but also a film.

In the present invention, the etching of the radicals indicates that the radicals are pushed in the inside of the projecting object by the ions, or that the radicals scatter from the surface of the object to be processed and thereby the radicals disappear from the surface of the object to be processed. Moreover, in the present invention, that the depositing speed of the radicals and the etching speed are equal to each other does not indicate that both the speeds are physically the same, but indicates that the surface of the object to be processed is covered by a layer of the radicals.

According to the present invention, because the surface of the object to be processed is covered by the radicals of the impurities at the time of introducing the radicals of the impurities into the inside of the object to be processed by making the depositing speed and the etching speed of the radicals of the impurities equal to each other, the surface of the object to be processed can be prevented from being etched by the ions. Consequently, when the present invention is applied to the formation of an extension region, the surface of the substrate can be prevented from being etched by the ions, and the sheet resistance value of the extension region formed in the substrate can be prevented from rising.

In the present invention, it is possible to control the dose quantity of the impurities introduced in the inside of the object to be processed by adjusting an integrated deposition quantity of the radicals deposited on the surface of the object to be processed.

In the present invention, it is possible to control a distribution of the impurities in a depth direction, the impurities being introduced into the inside of the object to be processed, by adjusting radiation energy of the ions. In addition, the distribution of the impurities in a depth direction indicates the concentration distribution of the impurities along the depth direction of an object to be processed in the present invention.

In the present invention, the ions may be radiated to the surface of the object to be processed before the radicals are deposited on the surface of the object to be processed. Hereby, the impurities introduced into the inside of the object to be processed can be prevented from being excessively diffused by a thermal processing of a post-process.

In order to solve the third problem, a manufacturing method of a semiconductor device of the present invention, comprises: a step of forming a gate insulation film on a surface of a substrate; a step of forming a gate electrode on the gate insulation film; a step of forming an extension region with the gate electrode used as a mask; a step of forming a spacer covering a side wall of the gate electrode; and a step of forming source/drain regions by using the gate electrode and the spacer as masks. The step of forming the extension region includes: a first step of generating plasma containing impurities to deposit radicals of the impurities in the plasma on the surface of the substrate; and a second step of radiating ions to the radicals deposited on the surface of the substrate at the first step.

According to the present invention, because the step of depositing the radicals of the impurities on the surface of the substrate and the step of radiating the ions on the surface of the substrate are separated from each other at the time of forming the extension region, the in-plane distribution of the radicals of the impurities deposited on the surface of the substrate and the in-plane distribution of the ions radiated to the surface of the substrate can independently be controlled. Therefore, the in-plane distribution of the radicals of the impurities on the surface of the substrate is improved at the first step, and the ions are radiated to the radicals of the impurities, the in-plane distribution of which has been improved, at the second step. Thereby, the impurities can be introduced uniformly in the inside of the substrate.

In the present invention, the step of forming the gate electrode includes a step of forming a gate electrode film to become the gate electrode, a step of introducing the impurities into the gate electrode film, and a step of patterning the gate electrode film in which the impurities are introduced, wherein the step of introducing the impurities into the gate electrode film includes a first sub-step of generating the plasma of the gas containing the impurities to deposit the radicals in the plasma on a surface of the gate electrode film, and a second sub-step of radiating the ions to the radicals deposited on the surface of the gate electrode film at the first sub-step.

Hereby, the in-plane distribution of the radicals of the impurities deposited on the surface of the gate electrode film and the in-plane distribution of the ions radiated onto the surface of the gate electrode film can independently be controlled at the time of introducing the impurities into the gat electrode film. Consequently, the in-plane distribution of the radicals of the impurities on the surface of the gate electrode film is improved at the first sub-step, and the ions are radiated to the radicals of the impurities, the in-plane distribution of which has been improved, at the second sub-step. Thereby, the impurities can be introduced uniformly in the gate electrode film.

In order to solve the fourth problem, a manufacturing method of a semiconductor device of the present invention, comprises: a step of forming a gate insulation film on a surface of a substrate; a step of forming a gate electrode on the gate insulation film; a step of forming an extension region by using the gate electrode as a mask, a step of forming a spacer covering a side wall of the gate electrode; and a step of forming source/drain regions with the gate electrode and the spacer used as masks. The step of forming the extension region is that of generating plasma of a gas containing impurities to introduce radicals of the impurities in the plasma into an inside of the substrate by means of ions while depositing the radicals on the surface of the substrate, and a depositing speed of the radicals on the surface of the substrate and an etching speed of the radicals etched by the ions are made to be equal to each other.

According to the present invention, because the surface of the substrate is covered by the radicals of the impurities at the time of forming the extension region by making the depositing speed and the etching speed of the radicals of the impurities equal to each other, the surface of the substrate can be prevented from being etched by the ions, and consequently a low resistance extension region can be formed.

In the present invention, the step of forming the gate electrode includes: a sub-step of forming a gate electrode film to become the gate electrode; a sub-step of introducing the impurities into the gate electrode film; and a sub-step of patterning the gate electrode film in which the impurities are introduced. The sub-step of introducing the impurities into the gate electrode film is that of generating the plasma of a gas containing the impurities to introduce the radicals of the impurities in the plasma into an inside of the gate electrode film by means of the ions while depositing the radicals on a surface of the gate electrode film, and a depositing speed of the radicals on the surface of the gate electrode film and an etching speed of the radicals etched by the ions are made to be equal to each other.

Hereby, because the surface of the gate electrode film is covered by the radicals of the impurities at the time of introducing the impurities into the gate electrode film by making the depositing speed and the etching speed of the radicals of the impurities equal to each other, the surface of the gate electrode film can be prevented from being etched by the ions. Consequently, the rise of the sheet resistance value of the gate electrode film can be prevented.

In addition, in the present invention, the ions of a rare gas can be used as the ions mentioned above.

BRIEF DESCRIPTION OF THE DRAWINGS

FIGS. 10(A) and 10(B) are views for describing the manufacturing method of an MISFET of a fourth embodiment of the present invention.

FIGS. 11(A) to 11(C) are views for describing the manufacturing method of the MISFET of the fourth embodiment of the present invention.

EMBODIMENTS FOR CARRYING OUT THE INVENTION

In the following, a plasma doping method of a first embodiment of the present invention will be described with reference to the accompanying drawings. In addition, the elements common to in each drawing are denoted by the same marks, and duplicating descriptions are omitted.

Figure 1:
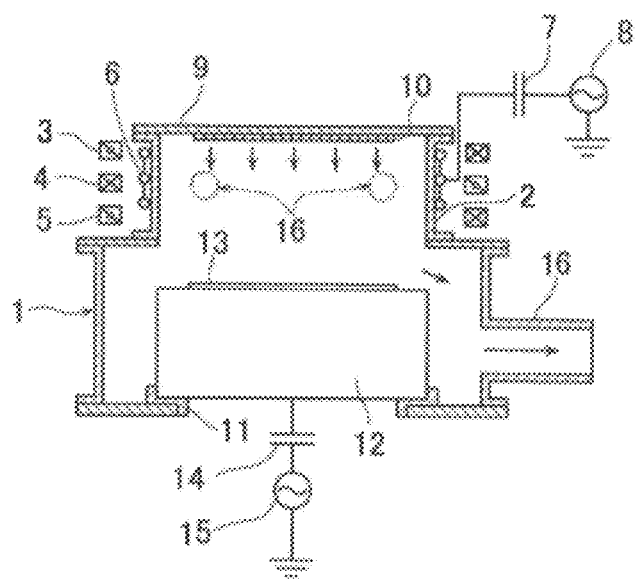
FIG. 1 is a view for describing the configuration of a plasma doping apparatus used in a first embodiment of the present invention.

A processing apparatus used in the present embodiment is, for example, an ICP (inductively coupled plasma) type plasma doping apparatus as shown in FIG. 1, and is equipped with a vacuum chamber 1 capable of forming a vacuum atmosphere.

The upper part of the vacuum chamber 1 is configured in cylinder portion 2, made of a dielectric, such as quartz, and the cylinder portion 2 functions as a plasma generation unit. Three ring-shaped magnetic field coils 3, 4, and 5, which can form a magnetic neutral line (NLD) in the cylinder portion 2, are arranged on the outside of the cylinder portion 2. A looped antenna coil 6 is arranged between the cylinder portion 2 and the magnetic field coils 3-5. The antenna coil 6 is connected to a high-frequency power source 8 through a capacitor 7 to be configured to be able to apply high-frequency power (also called "antenna RF power") for plasma generation.

An upper part aperture of the cylinder portion 2 is covered by a top plate 9, in which a gas inlet 10 for introducing a gas into the vacuum chamber 1 is formed. The other end of the gas inlet 10 communicates with a gas source through a not-shown gas tube and a not-shown mass flow controller.

Moreover, an electrode 12 is arranged at the bottom of the vacuum chamber 1 with an insulator member 11 put between the electrode 12 and the bottom. A substrate 13 is placed on the top surface, which is a substrate placing surface, of the electrode 12. A high-frequency power source 15 is connected to the electrode 12 through a blocking capacitor 14, so that bias potential can be applied. An exhaust pipe 16 is connected to the wall surface of the vacuum chamber 1 on the outside of the electrode 12. The exhaust pipe 16 communicates with vacuum exhaust means, composed of a not-shown turbo molecular pump, a not-shown rotary pump, a not-shown conductance-variable valve, or the like.

When a gas is supplied into the vacuum chamber 1 through the gas inlet 10 and currents are made to flow through the upper and the lower magnetic field coils 3 and 5 in the same direction and further a current is made to flow through the intermediate magnetic field coil 4 into the reverse direction, then a ring-like magnetic neutral line 16 is formed in the vacuum cylinder portion 2. When high-frequency power is supplied to the antenna coil 6 in this state, plasma is generated along the magnetic neutral line 16.

Here, because the extent of the magnetic neutral line 16 in the horizontal direction changes by the suitable adjustment of the current values of the currents made to flow through the magnetic field coils 3 and 5 and the current value of the current made to flow through the intermediate magnetic field coil 4, the extent distribution of the plasma can be controlled.

Figure 2:
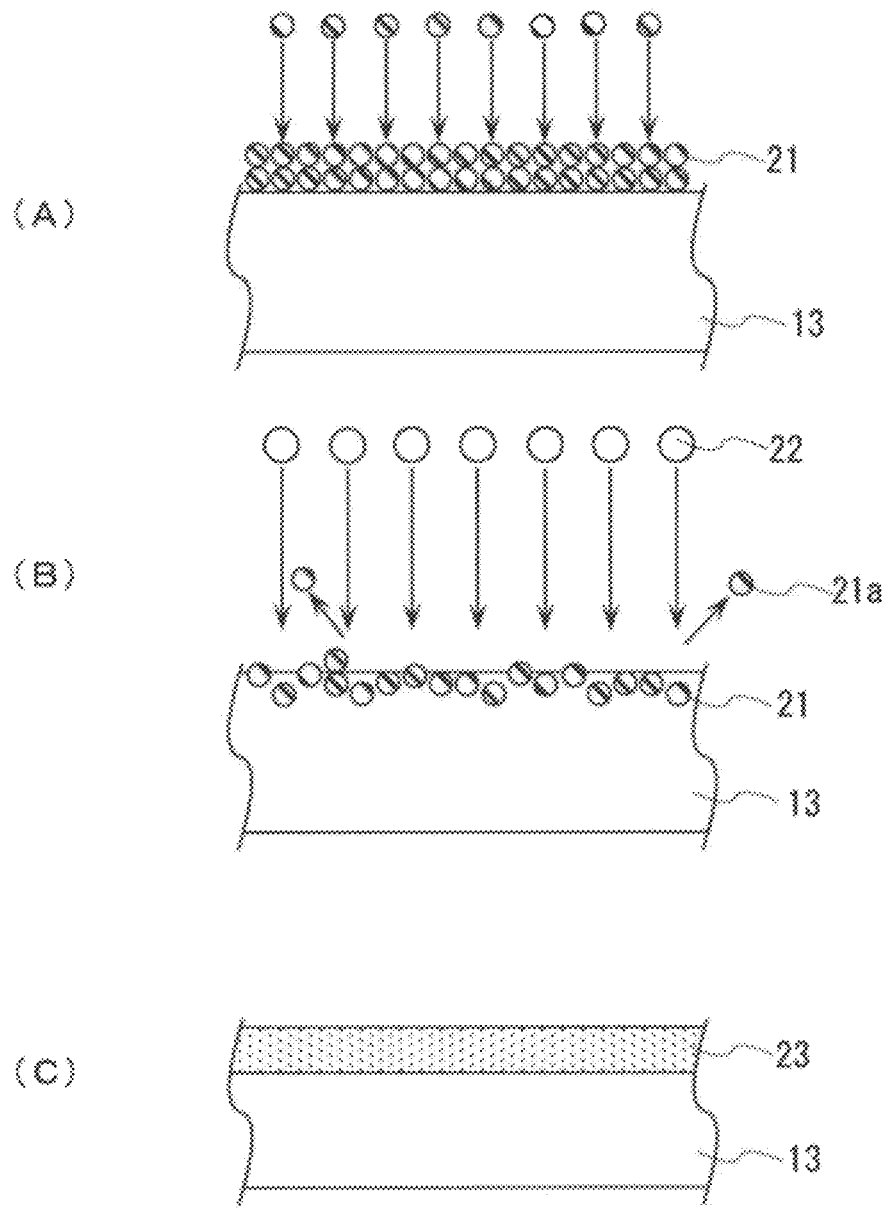
FIGS. 2(A) to 2(C) are views for describing a plasma doping method of the first embodiment of the present invention.

Next, a plasma doping method using the aforesaid plasma doping apparatus is described by exemplifying the introduction of boron into the silicon substrate 13 with reference to FIG. 2.

After the silicon substrate 13 is placed on the electrode 12, the vacuum exhaust means is operated to perform the vacuuming of the vacuum chamber 1 up to a desired degree of vacuum.

Next, a diborane ($B_2H_6$) gas, containing boron (B), which is a p-type impurity, Argon (Ar) gas, which is a rare gas, are supplied into the vacuum chamber 1 through the gas inlet 10. At the same time, currents are made to flow through the upper and the lower magnetic field coils 3 and 5 into the same direction, and a current is made to flow through the intermediate magnetic field coil 4 into the reverse direction, and thereby the magnetic neutral line 16 is formed in the cylinder portion 2. Furthermore, high-frequency power is applied from the high-frequency power source 8 to the antenna coil 6, and thereby plasma is generated along the magnetic neutral line 16.

Because no negative bias potential is applied to the electrode 12, the ions ($Ar^+$, $B_xH_y^+$) in the plasma is not drawn into the silicon substrate 13. Consequently, as shown in FIG. 2(A), the deposition of boron radicals 21 onto the surface of the silicon substrate 13 is dominant.

Here, in order to improve the in-plane distribution of the boron radicals 21 deposited on the surface of the silicon substrate 13, it is needed to improve the distribution of the boron radicals 21 in the plasma.

Accordingly, in the present embodiment, the distribution of the boron radicals 21 in the plasma is controlled by changing the extant of the magnetic neutral line 16 by adjusting the value of the current flowing through the magnetic field coils 3-5. For example, the in-plane distribution of the boron radicals 21 depositing on the surface of the silicon substrate 13 can be controlled by using the following deposition conditions.

[Deposition Conditions]
Flow rate of $B_2H_6$ diluted by 10% He: 6.14 [sccm]
Flow rate of Ar: 38.85 [sccm]
Concentration of $B_2H_6$: 1.36 [%]
Process pressure: 0.1 [Pa]
Antenna RF power: 300 [W]
Bias RF power: 0 [W]
Magnetic field coil currents (upper & lower/intermediate): 9.4 [A]/7.3 [A]

After performing the deposition of the boron radicals 21 onto the surface of the silicon substrate 13 for a predetermined time (for example, 20 seconds to 40 seconds) under the aforesaid deposition conditions, the supply of the diborane gas is stopped, bias potential is applied from the high-frequency power source 15 to the electrode 12 while the supply of the argon gas and the application of the high-frequency power to the antenna coil 6 are continued. Hereby, as shown in FIG. 2(B), argon ions ($Ar^+$) 22 are drawn (pulled) into the silicon substrate 13. The argon ions 22 drawn into the silicon substrate 13 collide with the boron radicals 21, and thereby the boron radicals 21 are pushed into the silicon substrate 13.

At this time, as shown in FIG. 2(B), a part of the boron radicals 21a are etched by the argon ions 22 to be scattered.

Here, in order to improve the in-plane distribution of the boron radicals 21 pushed in the silicon substrate 13, it is necessary to improve the in-plane distribution of the argon ions 22 drawn into the silicon substrate 13.

Accordingly, in the present embodiment, the distribution of the argon ions 22 in the plasma are controlled by changing the extent of the magnetic neutral line 16 by adjusting the current values of the currents flowing through the magnetic field coils 3-5. The distribution of the argon ions 22 in the plasma is different from that of the boron radicals 21. For example, the in-plane distribution of the argon ions 22 drawn into the silicon substrate 13 can be controlled by using the following argon ion radiation conditions. By changing the current value of the intermediate magnetic field coil 4 from the one in the aforesaid deposition conditions, the extent of the magnetic neutral line 16 is controlled to the optimum one for obtaining the uniform in-plane distribution of the argon ions 22 on the surface of the silicon substrate 13.

[Argon Ion Radiation Conditions]
Flow rate of $B_2H_6$ diluted by 10% He: 0 [sccm]
Flow rate of Ar: 38.85 [sccm]
Process pressure: 0.1 [Pa]
Antenna RF power: 300 [W]
Bias RF power: 530 [W]
Bias vpp: 1.5 [V]
Magnetic field coil currents (upper & lower/intermediate): 9.4 [A]/7.6 [A]

In addition, the bias RF power in the aforesaid argon ion radiation conditions may be set to 30 [W]. In this case, a bias peak-to-peak voltage Vp is 0.2 [V], and the radiation energy of the argon ions becomes small.

After that, thermal processing is performed in a not-shown publicly known lamp annealing apparatus, and thereby the boron radicals 21 introduced in the silicon substrate 13 are activated. As a result, as shown in FIG. 2(C), a p-type impurity diffusion layer 23 is formed in the silicon substrate 13 to be in the depth of, for example, 10 nm or less, preferably 5 nm or less.

In the first embodiment described above, after depositing the boron radicals 21 on the surface of the silicon substrate 13, the argon ions 22 are radiated onto the deposited boron radicals 21. The radiated argon ions 22 collide with the boron radicals 21, and thereby the boron radicals 21 are pushed into the silicon substrate 13.

According to the present embodiment, because the deposition step of the boron radicals 21 onto the surface of the silicon substrate 13 and the radiation step of the argon ions 22 to the surface of the silicon substrate 13 are separated unlike the prior art plasma doping method, the in-plane distribution of the boron radicals 21 and the in-plane distribution of the argon ions 22 on the surface of the silicon substrate 13 can independently be adjusted by adjusting the current values that are made to flow through the magnetic field coils 3-5 at each step. Hereby, because the in-plane distribution of the boron radicals 21 on the surface of the silicon substrate 13 can be improved, the impurities can uniformly be introduced into the silicon substrate 13.

Figure 3:
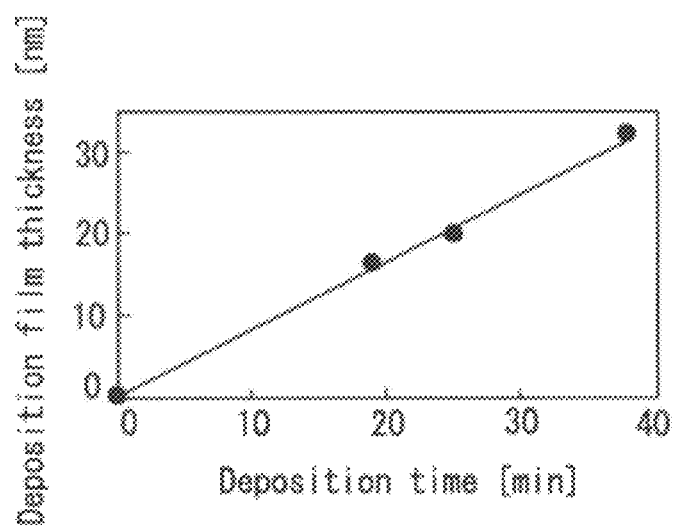
FIG. 3 is a diagram showing a relation between a deposition time and a deposition film thickness of boron radicals.

Now, after depositing the boron radicals 21 on the surface of the silicon substrate 13, the deposition film thickness of the boron radicals 21 can be measured by observing the silicon substrate 13 with a cross-sectional SEM. Here, it was found that a proportional relation existed between the deposition time and the deposition film thickness as shown in FIG. 3 by the measurement of the deposition film thickness of the boron radicals 21 at the time of performing deposition of the boron radicals 21 by changing the processing time (hereinafter referred to as "deposition time") in the aforesaid deposition conditions. Accordingly, the deposition film thickness can be controlled by adjusting the deposition time. In addition, when the depositing speed (deposition rate) of the boron radicals under the aforesaid deposition conditions was calculated, it was about 0.8 nm/min.

Now, in a plasma doping method of one step, as representative parameters for determining a dose quantity (doping quantity), the concentration of a gas containing impurities, a plasma density, bias potential, a processing time, and the like can be given. However, because these parameters are not independent but have mutual interactions, the dose quantity has actually been measured to the respective conditions setting these parameters.

In the present embodiment, as a result of changing the deposition film thickness of the boron radicals 21 on the surface of the silicon substrate 13, radiating the argon ions 22 under the same conditions, respectively, and measuring the dose quantity of the impurities in the silicon substrate 13, respectively, it was found that there was a correlation between the deposition film thickness and the dose quantity of the boron radicals 21. From this result, it was found that the boron atoms taken into the silicon substrate 13 were not the ions ($B_xH_y^+$) in the plasma injected by being accelerated by the bias potential, but were the boron radicals 21 deposited on the surface of the silicon substrate 13 and pushed in by the argon ions 22. Accordingly, the dose quantity of the impurities in the silicon substrate 13 can be controlled by adjusting the deposition film thickness (i.e., deposition time) of the boron radicals 21.

Moreover, the argon ions 22 were radiated while the radiation energy was changed by changing the bias voltage with the deposition film thickness of the boron radicals 21 fixed, and the distribution of the impurities in the depth direction at that time was measured. Consequently, it was found that there was a correlation between the bias voltage and the distribution of the impurities in the depth direction. That is, it was found that the higher the bias voltage was, the deeper the position where the impurities were distributed became. Accordingly, the distribution of the impurities in the depth direction of the silicon substrate 13 can be controlled by adjusting the radiation energy (i.e. bias voltage) of the argon ions 22.

Consequently, according to the present embodiment, because the control of the dose quantity of the impurities and the control of the distribution of the impurities in the depth direction can separately and independently be performed, it becomes easy to perform the condition setting at the time of applying the present embodiment to a manufacturing process of a semiconductor device.

Figure 4:
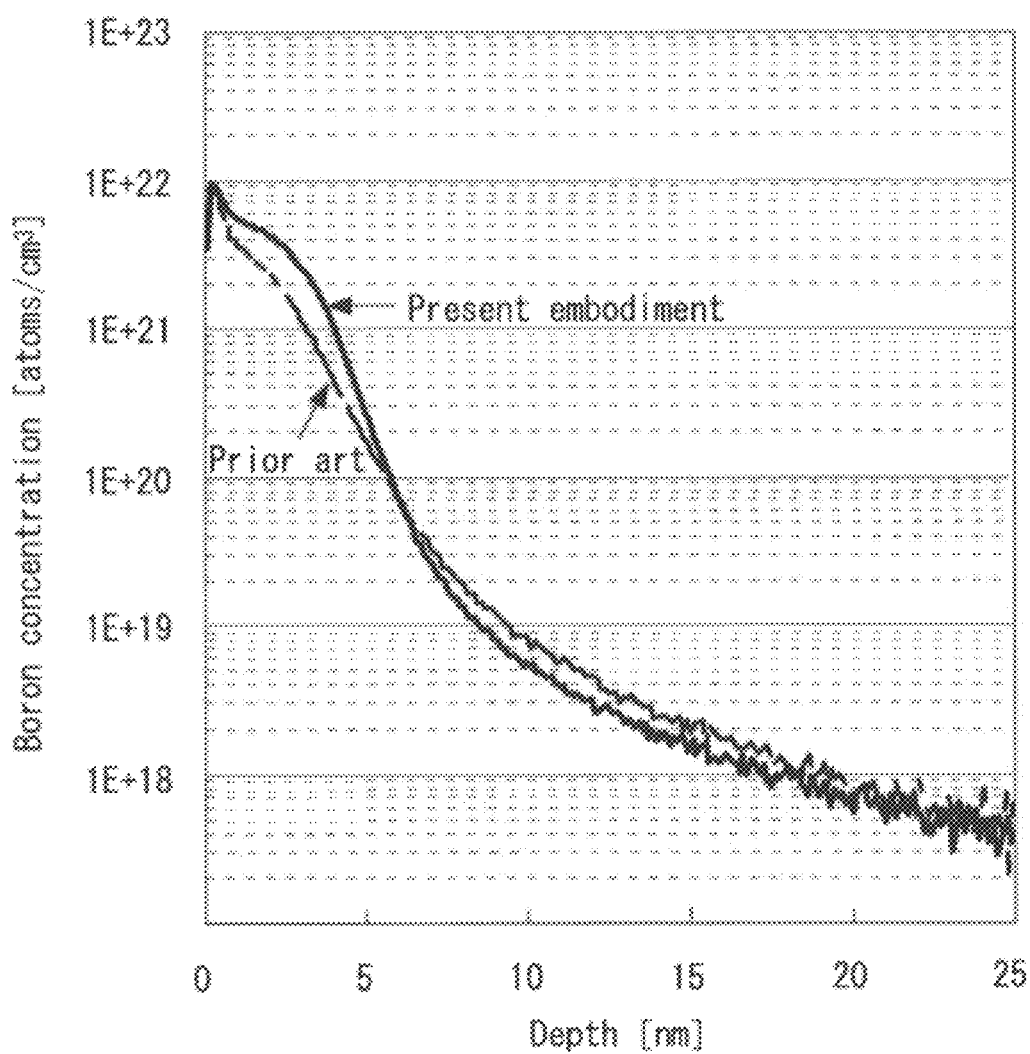
FIG. 4 is a diagram showing SIMS analysis results of the cases of using the plasma doping method of the first embodiment of the present invention and a plasma doping method of prior art.

Moreover, as the analysis results of a SIMS (Secondary Ion-microprobe Mass Spectrometer) shown in FIG. 4, impurities were introduced in silicon substrates so as to be equal dose quantities and depth distributions by using the plasma doping method of the present embodiment and a one-step plasma doping method, respectively. Here, in the plasma doping method of the present embodiment, after boron radicals were deposited for 40 seconds under the aforesaid deposition conditions, argon ions were radiated for 5 seconds under the aforesaid argon ion radiation conditions. On the other hand, in the one-step plasma doping method, the deposition of the boron radicals and the pushing-in of the boron radicals by the argon ions were simultaneously performed for 40 seconds. The sheet resistance values of the silicon substrates in which the impurities were introduced were severally measured. The results were that the sheet resistance value of the silicon substrate when the impurities were introduced by the plasma doping method of the present embodiment was 116 [Ω/]. On the other hand, the sheet resistance value of the silicon substrate when the impurities were introduced by the one-step plasma doping method was 231 [Ω/]. Consequently, it was found that the sheet resistance value lowered by pushing the boron radicals into the silicon substrate by argon ions. Accordingly, the rise of the sheet resistance value of the silicon substrate can be suppressed more than that of the case of using the one-step plasma doping method by introducing the impurities into the silicon substrate by using the plasma doping method of the present embodiment.

Moreover, it was found that the in-plane distribution of the sheet resistance values of the silicon substrates could be controlled within 1% by controlling the in-plane distribution of the deposition film thickness of the boron radicals on the surface of the silicon substrate to be within 3% by the standard deviation δ/average value.

Figure 5:
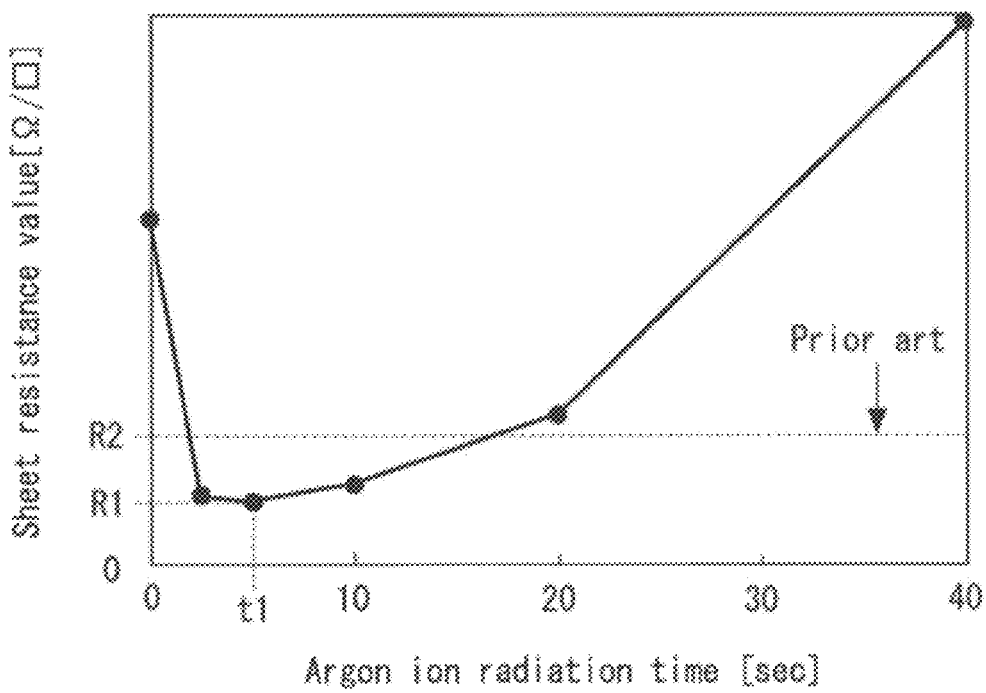
FIG. 5 is a diagram for describing changes of a sheet resistance value to argon ion radiation time.

Now, by introducing the impurities by two steps as described above, the sheet resistance value of the silicon substrate can be made to be lower than that of the case of introducing the impurities by one step. However, as shown by a solid line in FIG. 5, it was found that the sheet resistance value, which had once been lowered, rose as the argon ion radiation time became longer, and then became higher than the sheet resistance value R2 shown by a broken line in FIG. 5 in the case of introducing the impurities by the one-step plasma doping method (prior art).

As a result of an examination by the inventor of the present invention, it was found that the sheet resistance value R1 became lowest when no boron radicals existed on the surface of the silicon substrate (t1) by the introduction of the boron radicals and the etching by the argon ions, and that, if argon ions were continuously radiated after that, the surface of the silicon substrate was etched by the argon ions (that is, the silicon atoms in which the boron atoms were introduced were etched), so that the sheet resistance value rose.

Accordingly, the decreasing speed (hereinafter referred to as "etching rate") of the boron radicals by the argon ions is obtained in advance, and a time until the boron radicals do not exist on the surface of the silicon substrate is set on the basis of the etching rate to radiate the argon ions for the set time. Thereby, the surface of the silicon substrate can be prevented from being etched, and the rise of the sheet resistance value of the silicon substrate can be suppressed. Here, the etching rate of the boron radicals can be obtained from the observation results obtained by depositing boron radicals on the surfaces of silicon substrates to be the same film thicknesses, radiating argon ions to the boron radicals for different radiation times, and observing the respective remaining film thicknesses of the boron radicals at that time with a cross-sectional SEM.

As the aforesaid first embodiment, the plasma of a diborane gas and an argon gas are generated and no bias potential is applied to the silicon substrate 13 at the time of depositing the boron radicals 21, and the supply of the diborane gas is stopped and bias potential is applied to the silicon substrate 13 at the time of radiating the argon ions 22. Thereby, the deposition step of the boron radicals 21 and the radiation step of the argon ions 22 can execute the same vacuum chamber 1. Hereby, throughput can considerably be improved in comparison with the case of performing both the steps in separate chambers.

Figure 6:
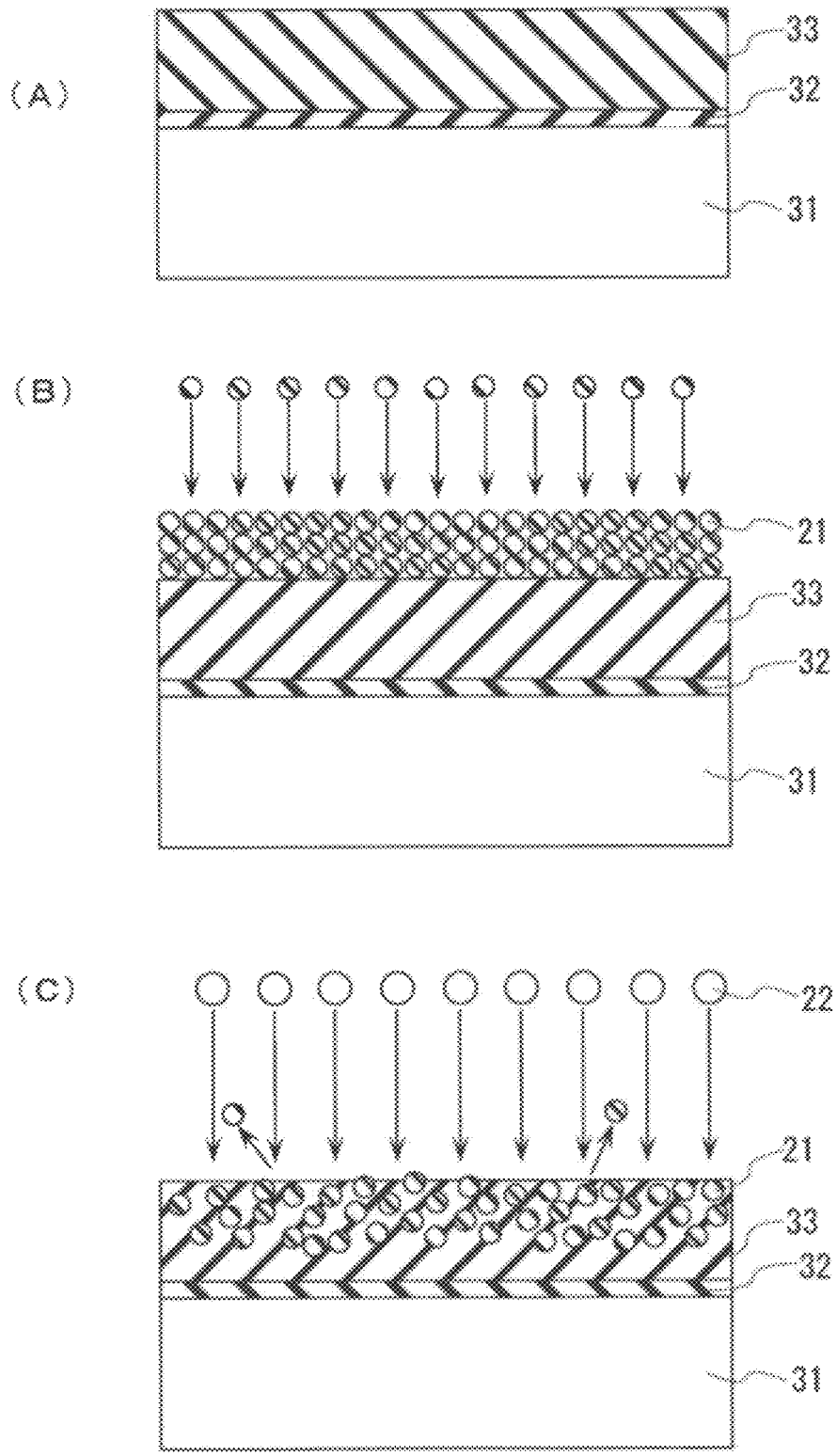
FIGS. 6(A) to 6(C) are views for describing a manufacturing method of an MISFET of a second embodiment of the present invention.
Figure 7:
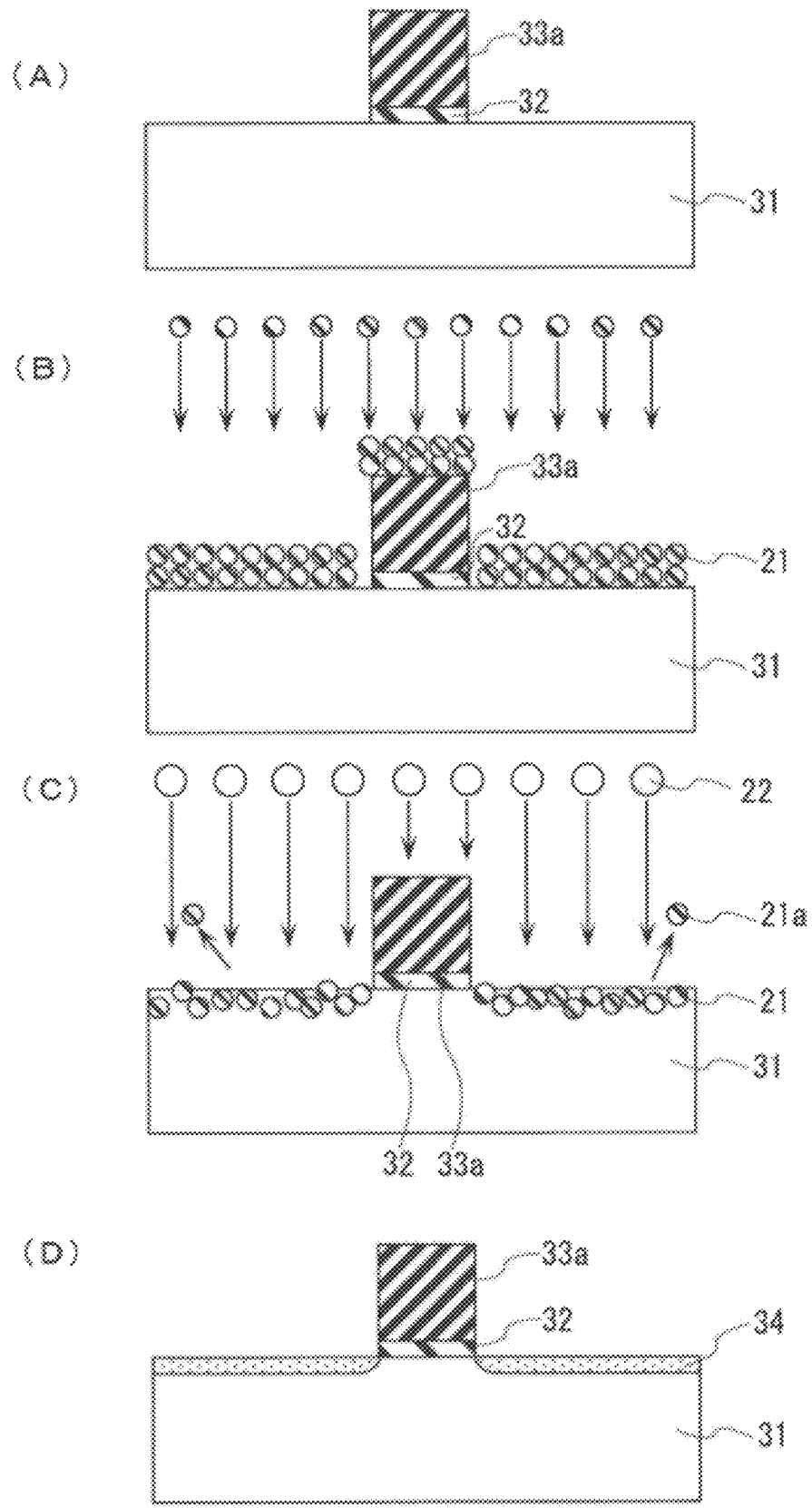
FIGS. 7(A) to 7(D) are views for describing the manufacturing method of the MISFET of the second embodiment of the present invention.
Figure 8:
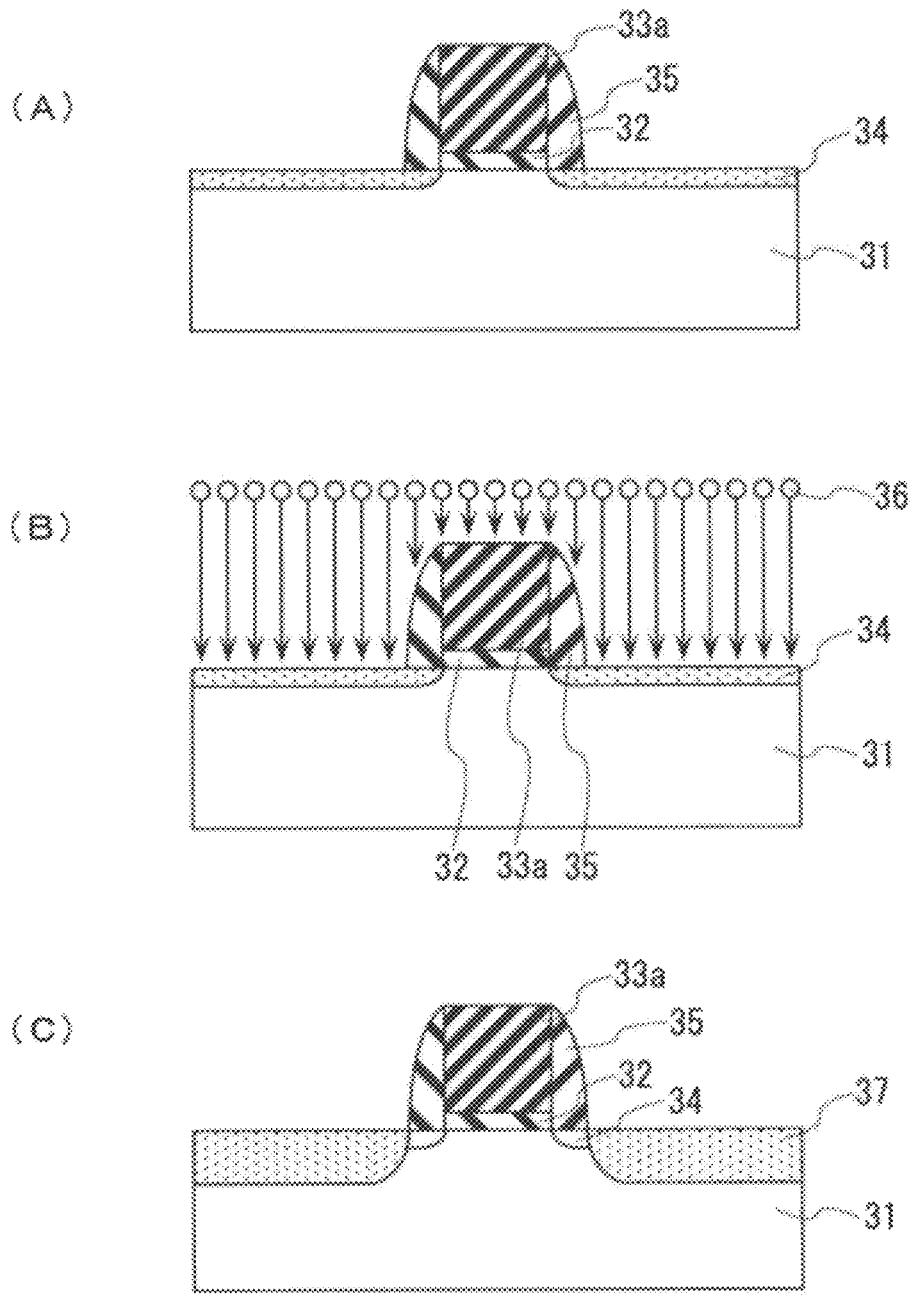
FIGS. 8(A) to 8(C) are views for describing the manufacturing method of the MISFET of the second embodiment of the present invention.

Next, with reference to FIGS. 6-8, a manufacturing method of a semiconductor device of a second embodiment, to which the aforesaid plasma doping method of the first embodiment is applied, will be described by illustrating a manufacturing method of a MISFET.

First, as shown in FIG. 6(A), a gate insulation film 32 is formed on a silicon substrate 31. As the gate insulation film 32, for example, not only a silicon oxide film and a silicon oxynitride film, both having a film thickness of from 0.5 nm to 1 nm, but also a high dielectric constant film (high-k film), such as a $HfO_x$ film, a $HfSiO_x$ film, and a $HfAlO_x$ film, all having a film thickness of from 2 nm to 3 nm, can be used. Also, a laminated film of the above-mentioned films can be used as the gate insulation film 32.

In addition, the silicon oxide film can be formed by using a thermal oxidization method, and the high dielectric constant film can be formed by using an ALD (atomic layer deposition) method and an MOCVD (metal organic chemical vapor deposition) method.

Next, a polysilicon film having a film thickness of from 70 nm to 100 nm is formed on the gate insulation film 32 by a LPCVD (low pressure chemical vapor deposition) method as a gate electrode film 33 to be a gate electrode 33a. In addition, the materials of the gate electrode film 33 are not limited to the polysilicon, but silicon germanium, a publicly known metal, and the like can be used.

Next, impurities are introduced in the polysilicon film 33 by using the plasma doping method of the aforesaid first embodiment.

First, as shown in FIG. 6(B), the boron radicals 21 are deposited on the surface of the polysilicon film 33. At this time, the aforesaid deposition conditions can be applied, and it is appropriate to adjust the deposition quantity (deposition time) of the boron radicals 21 according to a target dose quantity of boron (for example, $5 \times 10^{15}$ [$cm^{-2}$]).

After that, as shown in FIG. 6(C), the argon ions 22 are radiated, and the boron radicals 21 deposited on the surface of the polysilicon film 33 are pushed in. At this time, the aforesaid argon ion radiation conditions can be applied, and it is appropriate to adjust the radiation energy of the argon ions 22 according to the target depth distribution of boron (for example, $1 \times 10^{17}$ [$cm^{-3}$] or less at 50 nm to 60 nm). That is, it is appropriate to adjust the radiation energy of the argon ions 22 lest the impurities introduced in the polysilicon film 33 should reach the gate insulation film 32.

Then, a not-shown resist pattern is formed on the polysilicon film 33 by using a lithography technique, and the polysilicon film 33 and the gate insulation film 32 are etched with the resist pattern as a mask. Furthermore, for example, after the resist pattern has been removed by suitably performing ashing processing and SPM (sulfuric hydrogen peroxide mixture) processing, thermal processing for activating the boron introduced in the polysilicon film 33 is performed in the publicly known lamp annealing apparatus. Hereby, as shown in FIG. 7(A), a structure in which the gate insulation film 32 and the gate electrode 33a, composed of a polysilicon film in which boron is introduced, are laminated is formed.

Next, an extension region is formed in the silicon substrate 31 by using the plasma doping method of the aforesaid first embodiment.

First, as shown in FIG. 7(B), the boron radicals 21 are deposited on the surface of the silicon substrate 31. At this time, the aforesaid deposition conditions can be applied, and it is appropriate to adjust the deposition quantity (deposition time) of the boron radicals 21 according to the target dose quantity (for example, $1 \times 10^{15}$ [$cm^{-2}$]) of boron.

After that, as shown in FIG. 7(C), the argon ions 22 are radiated to push in the boron radicals 21 deposited on the surface of the silicon substrate 31. At this time, the aforesaid argon ion radiation conditions can be applied, and it is appropriate to adjust the radiation energy of the argon ions 22 according to the target depth distribution of boron (for example, $5 \times 10^{18}$ [$cm^{-3}$] or less at 10-15 nm).

Then, thermal processing for activating the boron introduced in the silicon substrate 31 is performed in the publicly known lamp annealing apparatus. Hereby, as shown in FIG. 7(D), a p-type extension region 34 having a depth of 10 nm or less is formed in such a manner that the gate electrode 33a lies between the extension regions 34.

Next, after forming a silicon oxide film on the whole surface of the silicon substrate 31, the silicon oxide film is etched, and thereby, as shown in FIG. 8(A), a spacer 35 covering the side wall of the gate electrode 33a is formed by a self-aligned manner.

Then, as shown in FIG. 8(B), boron ions 36 are injected into the silicon substrate 31 with the gate electrode 33a and the spacer 35 used as masks by the ion implantation method. Furthermore, by activating the injected boron ions 36 by thermal processing, source/drain regions 37 deeper than the extension region 34 are formed as shown in FIG. 8(C). A MISFET can be obtained through the aforesaid steps.

In the second embodiment described above, after depositing the boron radicals 21 on the surface of the silicon substrate 31, the argon ions 22 are radiated to the deposited boron radicals 21, at the time of forming the extension region 34 after the formation of the gate electrode 33a. The radiated argon ions 22 collide with the boron radicals 21, and thereby the boron radicals 21 are pushed into the silicon substrate 31.

According to the present embodiment, the deposition step of the boron radicals 21 on the surface of the silicon substrate 31, and the radiation step of the argon ions 22 to the surface of the silicon substrate 31 are separated from each other, the in-plane distribution of the boron radicals 21 and the in-plane distribution of the argon ions 22 on the surface of the silicon substrate 31 can independently be controlled. Consequently, the in-plane distribution of the boron radicals 21 on the surface of the silicon substrate 31 is improved, and rare gas ions are radiated to the boron radicals 21 whose in-plane distribution has been improved. Thereby, the impurities can uniformly be introduced into the silicon substrate 31, and the extension region 34 in which impurity concentration is uniform can be formed. Furthermore, according to the present embodiment, the rise of the sheet resistance value of the extension region 34 can be suppressed more than the case of forming the extension region by using the one-step plasma doping method.

Furthermore, in the present embodiment, it is possible to introduce boron into the polysilicon film 33 while suppressing the rise of the sheet resistance value of the polysilicon film 33, which is a gate electrode film, similarly to the case of the aforesaid extension region 34.

Figure 9:
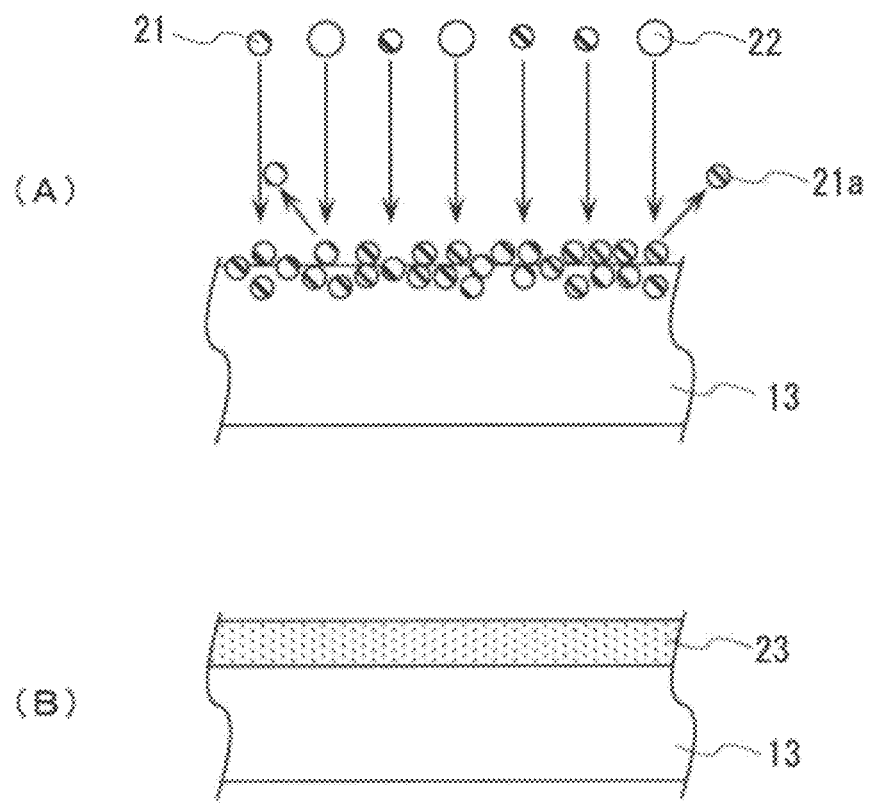
FIGS. 9(A) and 9(B) are views for describing a plasma doping method of a third embodiment of the present invention.

Next, a plasma doping method of a third embodiment of the present invention will be described with reference to FIG. 9 by illustrating the case of introducing boron into the silicon substrate 13. Because the plasma doping apparatus carrying out plasma doping processing is similar to that of the aforesaid first embodiment, the detailed description thereof is omitted here.

Similarly to the first embodiment, after placing the silicon substrate 13 on the electrode 12, the vacuum exhaust means is operated to perform the vacuuming of the vacuum chamber 1 to a desired degree of vacuum.

Next, a diborane ($B_2H_6$) gas containing boron (B), which is a p-type impurity, and an argon (Ar) gas, which is a rare gas, are supplied from the gas inlet 10 into the vacuum chamber 1. At the same time, currents are made to flow through the upper and lower magnetic field coils 3 and 5 in the same direction, and a current is made to flow through the intermediate magnetic field coil 4 in the reverse direction. Thereby, the magnetic neutral line 16 is formed in the cylinder portion 2.

Furthermore, when high-frequency power is applied from the high-frequency power source 8 to the antenna coil 6, plasma is generated along the magnetic neutral line 16, and the boron radicals 21 in the plasma are deposited on the surface of the silicon substrate 13 as shown in FIG. 9(A). At this time, when high-frequency power (hereinafter also referred to "bias RF power") is applied from the high-frequency power source 15 to the electrode 12, negative bias potential is applied to the electrode 12, and the argon ions ($Ar^+$) 22 in the plasma are drawn into the silicon substrate 13.

When the argon ions 22 drawn into the silicon substrate 13 collide with the boron radicals 21 deposited on the surface of the silicon substrate 13, the boron radicals 21 are pushed into the silicon substrate 13, and a part of the boron radicals 21a is scattered, as shown in FIG. 9(A).

Consequently, the deposition of the boron radicals 21 on the surface of the silicon substrate 13 and the etching of the boron radicals 21 by the argon ions 22 simultaneously proceed.

Here, the etching speed of the boron radicals 21 by the argon ions 22 generally easily becomes higher than the depositing speed of the boron radicals 21 on the surface of the silicon substrate 13. When the etching speed is higher than the depositing speed, the boron radicals 21 deposited on the surface of the silicon substrate 13 are not only etched by the argon ions 22, but also the surface of the silicon substrate 13, which is exposed by the etching of the boron radicals 21, is etched by the argon ions 22. Because boron is entered into the etched silicon atoms, the sheet resistance value of the silicon substrate 13 rises.

In the present embodiment, in order to prevent the surface of the silicon substrate 13 from being etched at the time of introducing the boron radicals 21 into the silicon substrate 13, the depositing speed of the boron radicals 21 on the surface of the silicon substrate 13 and the etching speed of the boron radicals 21 by the argon ions 22 are made to equal to each other. That is, the surface of the silicon substrate 13, into which the argon ions 22 are drawn at the time of introducing the boron radicals 21 into the silicon substrate 13, is made to be covered by the boron radicals 21.

Because the deposition speed of the boron radicals 21 has a correlation with the plasma density, the deposition speed can be controlled by suitably adjusting at least one of the density and the flow rate of a diborane gas, the flow rate of an argon gas, a process pressure, and antenna RF power. On the other hand, because the etching speed has a correlation with the radiation energy of the argon ions 22, the etching speed can be controlled by adjusting the bias RF power.

For example, the depositing speed of the boron radicals 21 and the etching speed of the boron radicals 21 by the argon ions 22 can be made to be equal to each other by using the doping conditions described in the following.

[Doping Conditions]
Flow rate of $B_2H_6$: 0.5 [sccm]
Flow rate of Ar: 49.5 [sccm]
Concentration of $B_2H_6$: 1.0 [%]
Antenna RF power: 300 [W]
Bias RF power: 30 [W]
Magnetic field coil currents (upper & lower/intermediate): 9.4 [A]/7.3 [A]

Here, the depositing speed of the boron radicals 21 can be obtained by depositing the boron radicals 21 on the surface of the silicon substrate 13 by not-performing the drawing of the argon ions 22 into the silicon substrate 13 by making the bias RF power zero, and by observing the silicon substrate 13 with the cross-sectional SEM to obtain the deposition film thickness of the boron radicals 21 obtained from the observation result. As shown in FIG. 3, there is a proportional relation between the deposition time and the deposition film thickness of the boron radicals 21.

On the other hand, the etching speed of the boron radicals 21 can be obtained by performing doping processing by supplying the bias RF power to the silicon substrate 13, on which the boron radicals 21 have been deposited to a predetermined film thickness in advance, and by observing the silicon substrate 13 with a cross-sectional SEM to obtain the etching speed from the film thickness of the boron radicals 21 obtained by the observation result. In addition, because also the deposition of the boron radicals 21 proceeds while the doping processing, it is appropriate to consider an already-known depositing speed of the boron radicals at the time of obtaining the etching speed of the boron radicals 21.

After performing the introduction of the boron radicals 21 into the silicon substrate 13 by using the aforesaid doping conditions for a predetermined time (for example, 20 seconds to 40 seconds), the supply of the diborane gas and the argon gas is stopped, and the application of the antenna RF power and the bias RF power is stopped.

After that, thermal processing is performed in a not-shown publicly known lamp annealing apparatus, and thereby the boron radicals 21 introduced in the silicon substrate 13 are activated. As a result, as shown in FIG. 9(B), the p-type impurity diffusion layer 23 is formed in the silicon substrate 13 to a depth of, for example, 10 nm or less, preferably 5 nm or less.

In the third embodiment described above, while depositing the boron radicals 21 on the surface of the silicon substrate 13, the argon ions 22 drawn into the surface of the silicon substrate 13 are made to collide with the deposited boron radicals 21. Hereby, the boron radicals 21 deposited on the surface of the silicon substrate 13 are pushed into the silicon substrate 13, and a part of the boron radicals 21 is scattered from the surface of the silicon substrate 13.

According to the present embodiment, the depositing speed of the boron radicals 21 on the surface of the silicon substrate 13 and the etching speed of the boron radicals 21 by the argon ions 22 are made to be equal to each other, and thereby the surface of the silicon substrate 13 is covered by the boron radicals 21 at the time of introducing the boron radicals 21 into the silicon substrate 13. Consequently, the surface of the silicon substrate 13 can be prevented from being etched by the argon ions 22. Consequently, the low resistance p-type impurity diffusion layer 23 can be formed.

For example, the sheet resistance value is 231 Ω/under the condition of the bias RF power being 530 W, at which value the etching speed becomes larger than the depositing speed (the conditions other than the bias RF power can be similar to those of the aforesaid doping conditions). On the other hand, the sheet resistance value is 205 Ω/under the aforesaid doping conditions of the bias RF power being 30 W under which the etching speed and the depositing speed are equal to each other.

Because the depositing speed of the boron radicals 21 is obtained in advance as described above, the integrated deposition film thickness of the boron radicals 21 can be changed by adjusting the doping processing time. As the results of the respective measurements of the dose quantities of the impurities (boron) in the respective silicon substrates 13 containing different integrated deposition film thicknesses of the boron radicals 21, it was found that there was a correlation between the integrated deposition film thickness and the dose quantity of the boron radicals 21. As the result, it was found that the boron taken in the silicon substrate 13 was not the impurity ions ($B_xH_y^+$) in the plasma that were accelerated by the bias potential and injected as they were, but that the boron was the boron radicals 21 that were deposited on the surface of the silicon substrate 13 and were pushed in by the argon ions 22. Consequently, the impurity dose quantity in the silicon substrate 13 can be controlled by adjusting the integrated deposition film thickness of the boron radicals 21 (that is, doping processing time).

Moreover, when the distributions of the impurities in the depth direction were measured at the time of changing the bias RF power (i.e. the radiation energy of argon ions) with the integrated deposition film thicknesses of the boron radicals 21 (i.e. doping processing times) fixed, it was found that there was a correlation between the bias RF power and the distribution of the impurities in the depth direction. That is, it was found that, the higher the bias RF power was, the deeper the position of the distribution of the impurities reached. Accordingly, the distribution of the impurities in the depth direction of the silicon substrate 13 can be controlled by adjusting the radiation energy of the argon ions 22.

Consequently, according to the present embodiment, because the control of the dose quantity of impurities and the control of the distribution of the impurities in the depth direction can separately and independently be performed, condition setting at the time of applying the present embodiment to the manufacturing process of a semiconductor device becomes easy.

Moreover, it was found that the in-plane distribution of the sheet resistance value of the silicon substrate 13 could be controlled within 1% by controlling the in-plane distribution of the deposition film thickness of the boron radicals 32 on the surface of the silicon substrate 13 to be within 3% by the standard deviation δ/average value. Here, the in-plane distribution of the deposition film thickness of the boron radicals 21 on the surface of the silicon substrate 13 is influenced by the distribution of the boron radicals 21 in the plasma. Accordingly, it is appropriate to set the aforesaid magnetic field coil currents (upper and lower/intermediate) in such a way that the distribution of the boron radicals 21 in the plasma becomes uniform.

Figure 12:
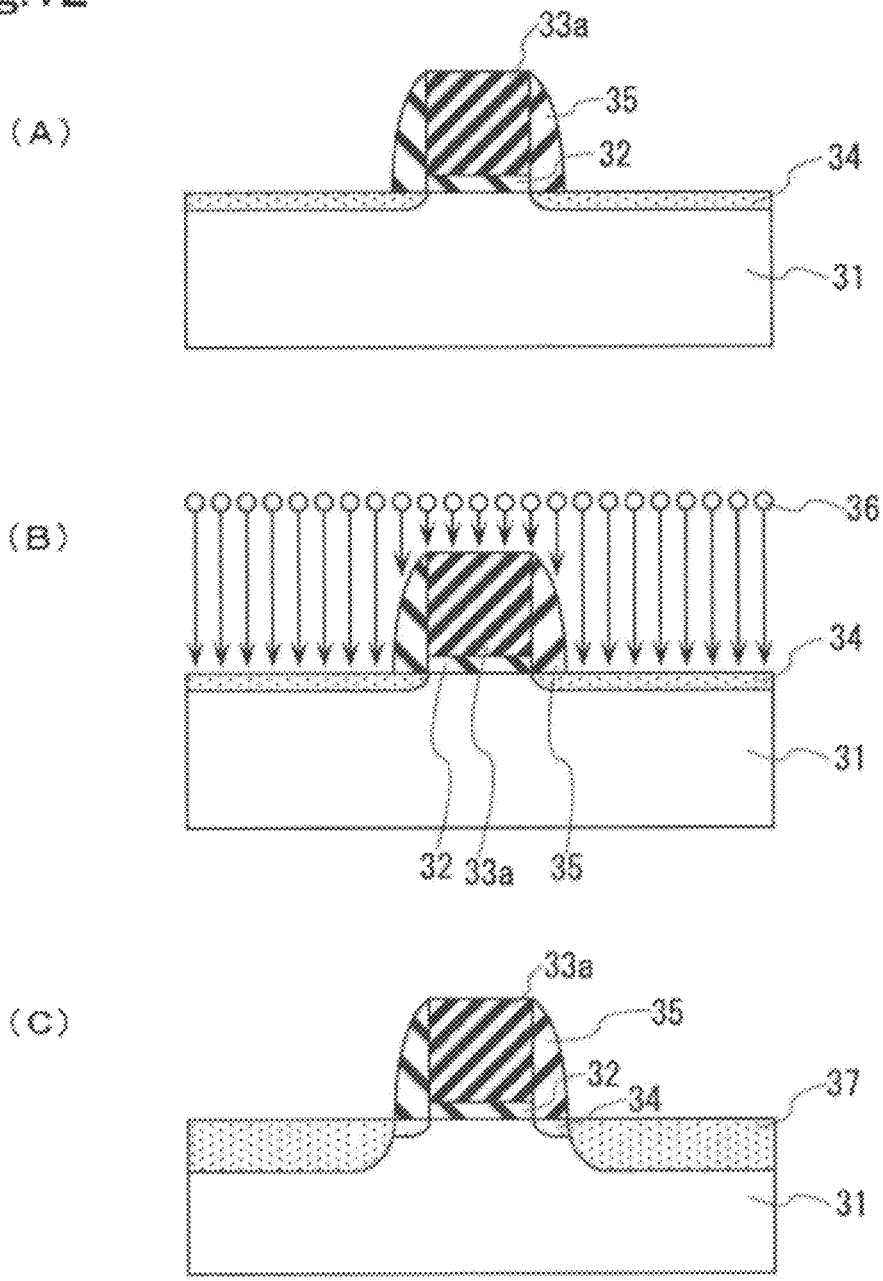
FIGS. 12(A) to 12(C) are views for describing the manufacturing method of the MISFET of the fourth embodiment of the present invention.

Next, with reference to FIGS. 10 to 12, a manufacturing method of a semiconductor device of a fourth embodiment, to which the aforesaid plasma doping method of the third embodiment is applied, will be described by illustrating a manufacturing method of a MISFET.

First, as shown in FIG. 10(A), the gate insulation film 32 is formed on the silicon substrate 31. As the gate insulation film 32, for example, a high dielectric constant film (high-k film), such as a $HfO_x$ film, a $HfSiO_x$ film, and a $HfAlO_x$ film, all having a film thickness of from 2 nm to 3 nm, or a laminated film of the above-mentioned films can be used in addition to a silicon oxide film and a silicon oxynitride film, both having a film thickness of from 0.5 nm to 1 nm.

In addition, the silicon oxide film can be formed by using the thermal oxidization method, and the high dielectric constant film can be formed by using the ALD (atomic layer deposition) method and the MOCVD (metal organic chemical vapor deposition) method.

Next, a polysilicon film having a film thickness of from 70 nm to 100 nm is formed on the gate insulation film 32 by the LPCVD (low pressure chemical vapor deposition) method as the gate electrode film 33 to be the gate electrode 33a. In addition, the materials of the gate electrode film 33 are not limited to the polysilicon, but silicon germanium, a publicly known metal, and the like can be used.

Next, impurities are introduced in the polysilicon film 33 by using the plasma doping method of the aforesaid third embodiment. That is, as shown in FIG. 10(B), the boron radicals 21 are pushed in the polysilicon film 33 by the argon ions 22 while depositing the boron radicals 21 on the surface of the polysilicon film 33. At this time, by applying the aforesaid deposition conditions, the depositing speed of the boron radicals 21 and the etching speed of the boron radicals 21 by the argon ions 22 are made to be equal to each other. In addition, a part of the boron radicals 21a is not pushed in the polysilicon film 33, but is scattered.

In addition, it is appropriate to adjust the doping time, determining the integrated deposition film thickness of the boron radicals 21, according to the target dose quantity of boron (e.g. $5 \times 10^{15}$ [$cm^{-2}$]), and for example, it is appropriate to set the doping time within a range of from 20 sec to 40 sec. Moreover, it is appropriate to adjust the bias RF power, determining the radiation energy of the argon ions 22, according to the target depth distribution of boron (for example, $1 \times 10^{17}$ [$cm^{-3}$] or less at the depth of 50 nm to 60 nm from the surface of the polysilicon film 33). That is, it is appropriate to determine the bias RF power lest the impurities introduced in the polysilicon film 33 should reach the gate insulation film 32.

Then, a not-shown resist pattern is formed on the polysilicon film 33 by using the lithography technique, and the polysilicon film 33 and the gate insulation film 32 are etched with the resist pattern used as a mask. Furthermore, for example, after the resist pattern is removed by suitably performing ashing processing and SPM (sulfuric hydrogen peroxide mixture) processing, thermal processing for activating the boron introduced in the polysilicon film 33 is performed in the publicly known lamp annealing apparatus. Hereby, as shown in FIG. 11(A), a structure in which the gate insulation film 32 and the gate electrode 33a, composed of a polysilicon film in which boron is introduced, are laminated is formed.

Next, an extension region is formed in the silicon substrate 31 by introducing impurities into the silicon substrate 31 by using the plasma doping method of the aforesaid third embodiment. That is, as shown in FIG. 11(B), while the boron radicals 21 are deposited on the surface of the silicon substrate 31, the deposited boron radicals 21 are pushed into the silicon substrate 31 by the argon ions 22. Similarly to the aforesaid introduction of the impurities into the polysilicon film 33, a part of the boron radicals 21a is not pushed into the silicon substrate 31, but is scattered. At this time, by applying the aforesaid doping conditions, the deposition speed of the boron radicals 21 and the etching speed of the boron radicals 21 are made to be equal to each other.

In addition, it is appropriate to adjust the doping time, determining the integrated deposition film thickness of the boron radicals 21, according to the target dose quantity (for example, $1 \times 10^{15}$ [$cm^{-2}$]) of boron, and it is appropriate to set the doping time, for example, within a range of from 20 sec to 40 sec. Moreover, it is appropriate to adjust the bias RF power, determining the radiation energy of the argon ions 22, according to the target depth distribution of boron (e.g. $5 \times 10^{18}$ [$cm^{-3}$] or less at the depth of 10 nm to 15 nm from the surface of the silicon substrate 31).

Then, thermal processing for activating the boron introduced in the silicon substrate 31 is performed in the publicly known lamp annealing apparatus. Hereby, as shown in FIG. 11(C), the p-type extension region 34 having a depth of 10 nm or less is formed in such a manner that the gate electrode 33a lies between the extension regions 34.

Next, after forming a silicon oxide film on the whole surface of the silicon substrate 31, the silicon oxide film is etched, and thereby, as shown in FIG. 12(A), the spacer 35 covering the side wall of the gate electrode 33a is formed by a self-aligned manner.

Then, as shown in FIG. 12(B), the boron ions 36 are injected into the silicon substrate 31 with the gate electrode 33a and the spacer 35 used as masks by the ion implantation method. Furthermore, by activating the injected boron ions 36 by thermal processing, source/drain regions 37 deeper than the extension region 34 are formed as shown in FIG. 12(C). A MISFET can be obtained through the aforesaid steps.

In the fourth embodiment described above, while depositing the boron radicals 21 on the surface of the silicon substrate 31, the deposited boron radicals 21 are pushed into the silicon substrate 31 by the argon ions 22 at the time of forming the extension region 34 after the formation of the gate electrode 33a. At this time, the deposition speed of the boron radicals 21 and the etching speed of the boron radicals 21 by the argon ions 22 are made to be equal to each other, and thereby the surface of the silicon substrate 31 is covered by the boron radicals 21. Consequently, the surface of the silicon substrate 31 can be prevented from being etched by the argon ions 22. Consequently, the rise of the sheet resistance value of the silicon substrate 31 can be prevented, and the lower resistance p-type extension region 34 can be formed.

Furthermore, in the present embodiment, similarly to the aforesaid extension region 34, the deposition speed of the boron radicals 21 and the etching speed of the boron radicals 21 are made to be equal to each other at the time of introducing the impurities into the polysilicon film 33, which is a gate electrode film. Hereby, the surface of the polysilicon film 33 is covered by the boron radicals 21, and consequently the surface of the polysilicon film 33 can be prevented from being etched by the argon ions 22. Consequently, the rise of the sheet resistance value of the polysilicon film 33 can be prevented.

In addition, the present invention is not limited to the aforesaid embodiments, but the present invention can be variously modified to be carried out within a scope of the spirit of the present invention.

For example, a boron trifluoride ($BF_3$) gas may be used in place of the diborane gas used at the time of the deposition of boron radicals. Moreover, other rare gases (such as helium) may be used in place of the argon gas.

Moreover, the plasma of a rare gas may be generated before the deposition of the boron radicals, and rare gas ions (such as argon ions) in the plasma may be radiated onto the surface of the silicon substrate 13 or the surface of the polysilicon film 33. Because the surface is hereby made to be amorphous, the excessive diffusion of the borane, introduced in the inside of the silicon substrate 13 or the polysilicon film 33, by the thermal processing of a post-process is suppressed.

Moreover, although the case of introducing boron, which is a p-type impurity, has been described in the aforesaid embodiments, the present invention can also be applied to the introduction of phosphorus or arsenic, which is an n-type impurity. In this case, it is appropriate to supply a phosphine ($PH_3$) gas or an arsine ($AsH_3$) gas in place of the diborane gas.

Moreover, the argon gas is not needed to be supplied at the time of the deposition of the boron radicals, and the diborane gas may be supplied at the time of the radiation of the argon ions. Moreover, the deposition of the boron radicals and the radiation of the argon ions may be performed in different vacuum chambers.

Moreover, although the case of introducing the impurities into the substrate or the film by using the ICP type apparatus has been described in the aforesaid embodiments, the apparatus for introducing the impurities is not limited to the ICP type one. For example, a parallel plate type apparatus may be used.

Moreover, it is also possible not to radiate the argon ions in plasma to the surface of a substrate, but to lead the argon ions generated by a publicly known ion generation mechanism to the surface of the substrate to radiate the argon ions thereon, and to push boron radicals into the substrate or the film.

DESCRIPTION OF REFERENCE NUMERALS AND CHARACTERS 1 vacuum chamber
13 silicon substrate
15 high-frequency power source
21 boron radical
22 argon ion
23 impurity diffusion layer
31 silicon substrate
32 gate insulation film
33 gate electrode film
33a gate electrode
34 extension region
35 spacer
37 source/drain regions

What is claimed is:
1. A manufacturing method of a semiconductor device, comprising:
 a step of forming a gate insulation film on a surface of a substrate;
 a step of forming a gate electrode on the gate insulation film;
 step of forming an extension region with the gate electrode used as a mask;
 a step of forming a spacer covering a side wall of the gate electrode; and
 a step of forming source/drain regions by using the gate electrode and the spacer as masks, wherein the step of forming the extension region includes:
  a first step of generating plasma containing impurities to deposit radicals of the impurities in the plasma on the surface of the substrate; and
  a second step of radiating ions to the radicals deposited on the surface of the substrate at the first step,
 wherein a time until the radicals deposited at the first step do not exist on the surface of the substrate is set based on an etching rate of the radicals etched by the ions radiated at the second step, and the second step is performed for the set time.

2. The manufacturing method of a semiconductor device according to claim 1, wherein the step of forming the gate electrode includes:
 a step of forming a gate electrode film to become the gate electrode;
 a step of introducing the impurities into the gate electrode film; and
 a step of patterning the gate electrode film in which the impurities are introduced, and wherein the step of introducing the impurities into the gate electrode film includes:
  a first sub-step of generating the plasma of the gas containing the impurities to deposit the radicals of the impurities in the plasma on a surface of the gate electrode film; and
  a second sub-step of radiating the ions to the radicals deposited on the surface of the gate electrode film at the first sub-step.

3. The manufacturing method of a semiconductor device according to claim 1, wherein the ions are those of a rare gas.

4. A manufacturing method of a semiconductor device, comprising:
- a step of forming a gate insulation film on a surface of a substrate;
- a step of forming a gate electrode on the gate insulation film;
- step of forming an extension region with the gate electrode used as a mask;
- a step of forming a spacer covering a side wall of the gate electrode; and
- a step of forming source/drain regions by using the gate electrode and the spacer as masks, wherein the step of forming the extension region includes:
  - a first step of generating plasma containing impurities to deposit radicals of the impurities in the plasma on the surface of the substrate; and
  - a second step of radiating ions to the radicals deposited on the surface of the substrate at the first step,
  - wherein a dose quantity of the impurities introduced into the inside of the substrate is controlled by adjusting a deposition quantity of the radicals deposited on the surface of the substrate.

* * * * *